(12) United States Patent
Kim et al.

(10) Patent No.: US 8,502,580 B2
(45) Date of Patent: Aug. 6, 2013

(54) SEMICONDUCTOR DEVICE AND METHOD FOR OPERATING THE SAME

(75) Inventors: Yong-Hoon Kim, Gyeonggi-do (KR); Hyun-Woo Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 134 days.

(21) Appl. No.: 12/648,795

(22) Filed: Dec. 29, 2009

(65) Prior Publication Data

US 2011/0156771 A1 Jun. 30, 2011

(30) Foreign Application Priority Data

Dec. 28, 2009 (KR) .......................... 10-2009-0132040

(51) Int. Cl.
*H03L 7/06* (2006.01)

(52) U.S. Cl.
USPC ............................ 327/159; 327/156; 375/376

(58) Field of Classification Search
USPC ......................................... 327/156, 158, 159
See application file for complete search history.

(56) References Cited

U.S. PATENT DOCUMENTS

| 6,711,230 | B1 * | 3/2004 | Nicholls et al. ............... 375/376 |
| 7,436,227 | B2 * | 10/2008 | Thomsen et al. ............. 327/147 |
| 2008/0174349 | A1 * | 7/2008 | Luo et al. ....................... 327/157 |
| 2008/0191746 | A1 * | 8/2008 | Friedman et al. ................. 327/5 |
| 2008/0191757 | A1 * | 8/2008 | Choi .............................. 327/149 |
| 2010/0213995 | A1 * | 8/2010 | Lee ................................ 327/158 |
| 2010/0246294 | A1 * | 9/2010 | Chuang et al. ................. 365/194 |

FOREIGN PATENT DOCUMENTS

| KR | 1020050074247 | 7/2005 |
| KR | 1020070036549 | 4/2007 |
| KR | 1020070069345 | 7/2007 |
| KR | 1020080076615 | 8/2008 |

OTHER PUBLICATIONS

Notice of Allowance issued by the Korean Intellectual Property Office on Mar. 27, 2012.

* cited by examiner

*Primary Examiner* — Ryan Jager
(74) *Attorney, Agent, or Firm* — IP & T Group LLP

(57) ABSTRACT

A semiconductor device includes: an internal clock signal generation unit configured to receive an external clock signal and to generate an internal clock signal in response to a control signal; and a monitoring unit configured to monitor environmental elements reflected in a circuit response to the control signal.

13 Claims, 4 Drawing Sheets

US 8,502,580 B2

SEMICONDUCTOR DEVICE AND METHOD FOR OPERATING THE SAME

CROSS-REFERENCE TO RELATED APPLICATIONS

The present application claims priority of Korean Patent Application No. 10-2009-0132040, filed on Dec. 28, 2009, which is incorporated herein by reference in its entirety.

BACKGROUND OF THE INVENTION

Exemplary embodiments of the present invention relate to semiconductor design technology, and more particularly, to a semiconductor device for generating an internal clock signal and a method for operating the same.

In general, semiconductor devices including Double Data Rate Synchronous DRAMs (DDR SDRAMs) receive an external clock signal to generate an internal clock signal, and use the internal clock signal as a reference signal for controlling a variety of operation timings in the semiconductor devices. Therefore, the semiconductor devices include an internal clock signal generation circuit configured to generate an internal clock signal. Examples of the internal clock signal generation circuit may include a Delay Locked Loop (DLL) and a Phase Locked Loop (PLL). Hereafter, the DLL is described as a representative example for convenience of explanation.

FIG. 1 is a block diagram of a conventional DLL.

Referring to FIG. 1, the DLL includes a variable delay unit 110, a delay replica modeling unit 120, a phase detection unit 130, a control signal generation unit 140, a delay line control unit 150, and a locking detection unit 160.

The variable delay unit 110 is configured to delay an external clock signal CLK_EXT by a time period corresponding to one of the delay control signals SH0 to SHN to generate a DLL clock signal CLK_DLL. The DLL clock signal generated in such a manner is inputted to the delay replica modeling unit 120. The delay replica modeling unit 120 includes a clock path and a data path modeled in the semiconductor device. The DLL clock signal CLK_DLL is delayed by a time period modeled in the delay replica modeling unit 120, and becomes a feedback clock signal CLK_FED. The phase detection unit 130 is configured to compare the phase of the external clock signal CLK_EXT with that of the feedback clock signal CLK_FED, and to generate a phase detection signal DET_PHS corresponding to the comparison result.

The control signal generation unit 140 is configured to generate an up/down control signal CTR_UD in response to the phase detection signal DET_PHS. The delay line control unit 150 is configured to generate the delay control signals SH0 to SHN in response to the up/down control signal CTR_UD. The generated delay control signals SH0 to SHN control a delay amount reflected in the variable delay unit 110. The locking detection unit 160 is configured to generate a locking detection signal DET_LOC in response to the phase detection signal DET_PHS. The locking detection signal DET_LOC is activated when the locking operation of the DLL has been completed.

Through such a configuration, the DLL generates one of the delay control signals SH0 to SHN such that the phase of the external clock signal CLK_EXT becomes identical to that of the feedback clock signal CLK_FED, and then generates a DLL clock signal CLK_DLL corresponding to the delay control signal. Such a state in which the two phases become identical is referred to as 'locking'. The DLL clock signal CLK_DLL generated after the locking operation has been completed is transferred to a circuit configured to output data, and the data is synchronized with the transferred DLL clock signal CLK_DLL and then outputted. The data which is synchronized with the DLL clock signal CLK_DLL and outputted operates as if the data is synchronized with the external clock signal CLK_EXT and then outputted.

Meanwhile, the duty cycle ratios of the external clock signal CLK_EXT inputted to the DLL, the outputted DLL clock signal CLK_DLL, and the feedback signal CLK_FED may be distorted depending on environmental elements reflected in the DLL, such as fabrication processes, supplied voltages, and temperature. When the duty cycle ratios of the clock signals are distorted, the performance of the DLL may be degraded. Furthermore, since such environmental elements may change a variety of delay times reflected in the DLL, the DLL may not perform a desired operation. Therefore, to compensate for the distorted duty cycle ratios of the clock signals or for the changed delay times, a circuit capable of monitoring environmental elements reflected in the circuit is preferentially required.

SUMMARY OF THE INVENTION

An embodiment of the present invention is directed to a semiconductor device capable of monitoring environmental elements reflected in a circuit by using a control signal used for generating an internal clock signal, and by correcting the duty cycle ratio of a clock signal or delay times depending on the monitoring result.

In accordance with an embodiment of the present invention, a semiconductor device includes: an internal clock signal generation unit configured to receive an external clock signal and to generate an internal clock signal in response to a control signal; and a monitoring unit configured to monitor environmental elements reflected in a circuit in response to the control signal.

The internal clock signal generation unit may be controlled by an output signal of the monitoring unit.

The semiconductor device may further include a locking detection unit configured to detect a locking operation completion time of the internal clock signal generation unit.

The monitoring unit may perform a monitoring operation after a locking operation has been completed.

The internal clock signal generation unit may include a variable delay unit configured to delay the external clock signal by a time period corresponding to the delay control signal and to generate the internal clock signal; a delay replica modeling unit configured to delay the internal clock signal by a time period corresponding to a clock path and data path modeled in the circuit, and to generate a feedback clock signal; a phase detection unit configured to compare a phase of the external clock signal with that of the feedback clock signal; a control signal generation unit configured to generate the control signal in response to an output signal of the phase detection unit; and a delay line control unit configured to control a time delay amount of the variable delay unit in response to the control signal.

The internal clock signal generation unit may include a phase detection unit configured to compare the phase of the external clock signal with that of the feedback clock signal; a control signal generation unit configured to generate the control signal in response to the output signal of the phase detection unit; and a clock signal oscillation unit configured to generate the internal clock signal at a frequency corresponding to that of the control signal.

The monitoring unit may perform a monitoring operation in response to an auto-refresh operation.

In accordance with another embodiment of the present invention, a semiconductor device includes: an internal clock signal generation unit configured to receive an external clock signal and to generate an internal clock signal in response to a control signal; a monitoring unit configured to monitor environmental elements reflected in a circuit in response to the control signal; and a duty cycle correction unit configured to correct the duty cycle ratio of either the external clock signal or the internal clock signal in response to the output signal of the monitoring unit.

In accordance with yet another embodiment of the present invention, a method for operating a semiconductor device includes: comparing the phase of an external clock signal with that of a feedback clock signal, and generating an internal clock signal through either an up frequency operation or a down frequency operation in response to the comparison result; and generating a monitoring result signal in response to a control signal corresponding to either the up frequency operation or the down frequency operation, after a locking operation of the internal clock signal has been completed.

The semiconductor device in accordance with the embodiments of the present invention may monitor environmental elements reflected in the circuit using a control signal used in an internal clock signal generation circuit, and correct either the duty cycle ratio of a clock signal or the delay times depending on the monitoring result.

DESCRIPTION OF THE INVENTION

Figure 1:
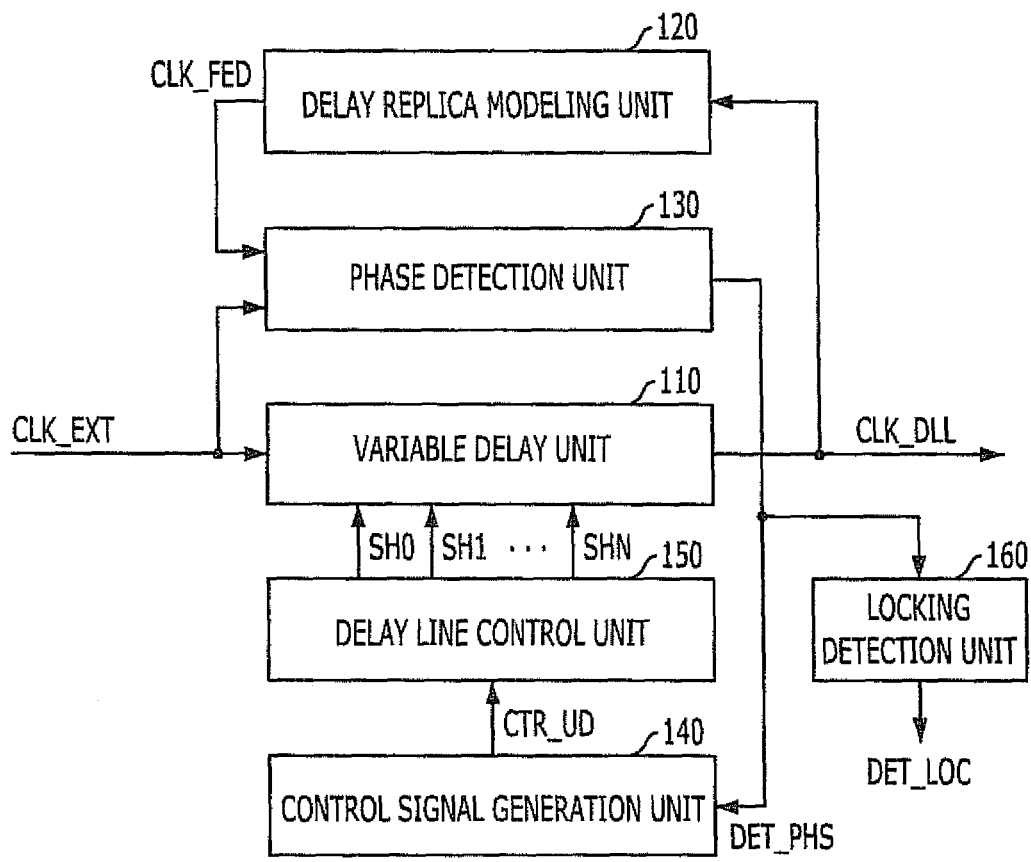
FIG. 1 is a block diagram of a conventional Delay Locked Loop (DLL).

Exemplary embodiments of the present invention are described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
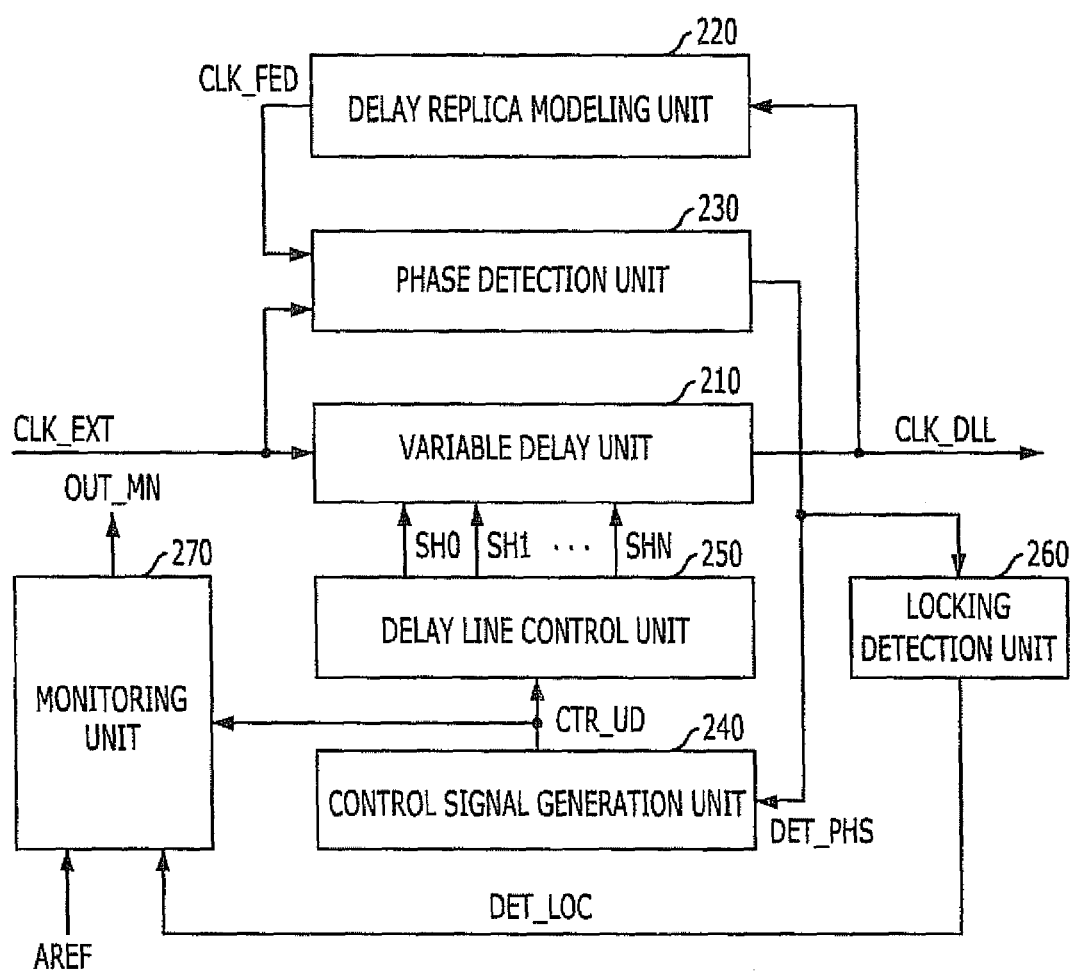
FIG. 2 is a block diagram of a semiconductor device in accordance with an embodiment of the present invention.

FIG. 2 is a block diagram of a semiconductor device in accordance with an embodiment of the present invention.

Referring to FIG. 2, the semiconductor device includes a variable delay unit 210, a delay replica modeling unit 220, a phase detection unit 230, a control signal generation unit 240, a delay line control unit 250, a locking detection unit 260, and a monitoring unit 270. For reference, the variable delay unit 210, the delay replica modeling unit 220, the phase detection unit 230, the control signal generation unit 240, and the delay line control unit 250 compose an internal clock signal generation circuit, that is, a Delay Locked Loop (DLL) which receives an external clock signal CLL_EXT and generates a DLL clock signal CLK_DLL by reflecting a delay time corresponding to one of the delay control signals SH0 to SHN.

Hereafter, the respective components are described in detail.

The variable delay unit 210 is configured to delay an external clock signal CLK_EXT by a time period corresponding to one of the delay control signals SH0 to SHN to generate a DLL clock signal. The variable delay unit 210 may include a plurality of unit delay cells which are controlled in response to the delay control signals SH0 to SHN.

The delay replica modeling unit 220 is configured to model a clock path and a data path modeled in the semiconductor device. The DLL clock signal is delayed by a time period modeled in the delay replica modeling unit 220, and becomes a feedback signal CLK_FED. That is, a path through which the external clock signal CLK_EXT inputted from outside is transferred to the DLL, a path through which the DLL clock signal generated by the DLL is transferred to a driver for outputting data, and a path through which data is transferred for synchronization with the DLL clock signal are modeled in the delay replica modeling unit 220.

The phase detection unit 230 is configured to compare the phase of the external clock signal CLK_EXT with that of the feedback clock signal CLK_FED and to generate a phase detection signal DET_PHS. The phase detection signal DET_PHS is outputted as a signal corresponding to the phase of the feedback clock signal CLK_FED either leading or lagging the phase of the external clock signal CLK_EXT.

The control signal generation unit 240 is configured to generate an up/down control signal CTR_UD in response to the phase detection signal DET_PHS. The up/down control signal CTR_UD becomes a source of the delay control signals SH0 to SHN for either increasing or decreasing a delay time reflected in the variable delay unit 210.

The delay line control unit 250 is configured to output the delay control signals SH0 to SHN in response to the up/down control signal CTR_UD. The delay control signals SH0 to SHN determine the number of unit delay cells from among a plurality of unit delay cells provided in the delay line control unit 250, which are activated in response to the up/down control signal CTR_UD. Therefore, a time delay amount of the variably delay unit 210 is determined depending on the delay control signals SH0 to SHN.

The locking detection unit 260 serves to detect a locking operation completion time of the DLL, and is configured to generate a locking detection signal DET_LOC in response to the phase detection signal DET_PHS. The locking detection signal DET_LOC is activated when the locking operation of the DLL has been completed.

The monitoring unit 270 serves to monitor environmental elements reflected in the circuit, and is configured to generate a monitoring result signal OUT_MN in response to the up/down control signal. The monitoring unit 270 may perform an operation after the locking operation completion time. In order for the operation to be performed, the monitoring unit 270 must receive the locking detection signal DET_LOC.

Hereafter, the operation of the monitoring unit 270 is described in detail.

The up/down control signal CTR_UD has a value corresponding to a phase difference between the external clock signal CLK_EXT and the feedback clock signal CLK_FED. That is, when the delay time of the variable delay unit 210 is to be increased (hereafter, referred to as an 'up operation'), an up/down control signal CTR_UD corresponding to the up operation is generated. On the other hand, when the delay time of the variable delay unit 210 is to be decreased (hereafter, referred to as a 'down operation'), an up/down control signal CTR_UD corresponding to the down operation is generated.

Therefore, when a delay time set in the DLL is changed or a duty cycle ratio is distorted by an environmental element reflected in the circuit after the locking operation has been completed, the up/down signal CTR_UD is outputted as a value corresponding to this state, and the monitoring unit 270 generates a monitoring result signal OUT_MN corresponding to the state. In other words, when the level of a voltage supplied to the DLL increases or decreases, the duty cycle ratio of a clock signal may be distorted, or the set delay time amount may be changed. The up/down control signal CTR_UD has a value corresponding to this state. Therefore, in this embodiment of the present invention, as the monitoring result signal OUT_MN is generated in accordance with the up/down control signal, it is sensed that the environmental element reflected in the circuit, that is, the voltage supplied to the DLL, has been changed.

More specifically, when the up/down control signal CTR_UD consecutively has a value corresponding to the up operation depending on environmental elements reflected in the circuit after the locking operation has been completed, the monitoring result signal OUT_MN becomes a logic high level, for example. When the up/down control signal CTR_UD consecutively has a value corresponding to the down operation, the monitoring result signal OUT_MN becomes a logic low level. In this embodiment of the present invention, the monitoring result signal OUT_MN generated in such a manner may be used to control a circuit composing the DLL or a Duty Cycle Corrector (DCC), which is described below, to compensate for a change caused by the environmental element reflected in the circuit.

Meanwhile, the monitoring unit 270 may perform an operation in accordance with an auto-refresh operation. In order for the operation, the monitoring unit 270 receives a refresh signal AREF which is activated during the auto-refresh operation. Therefore, the monitoring unit 270 in accordance with this embodiment of the present invention may monitor a change caused by the environmental element reflected in the circuit, in response to the auto-refresh operation.

Figure 3:
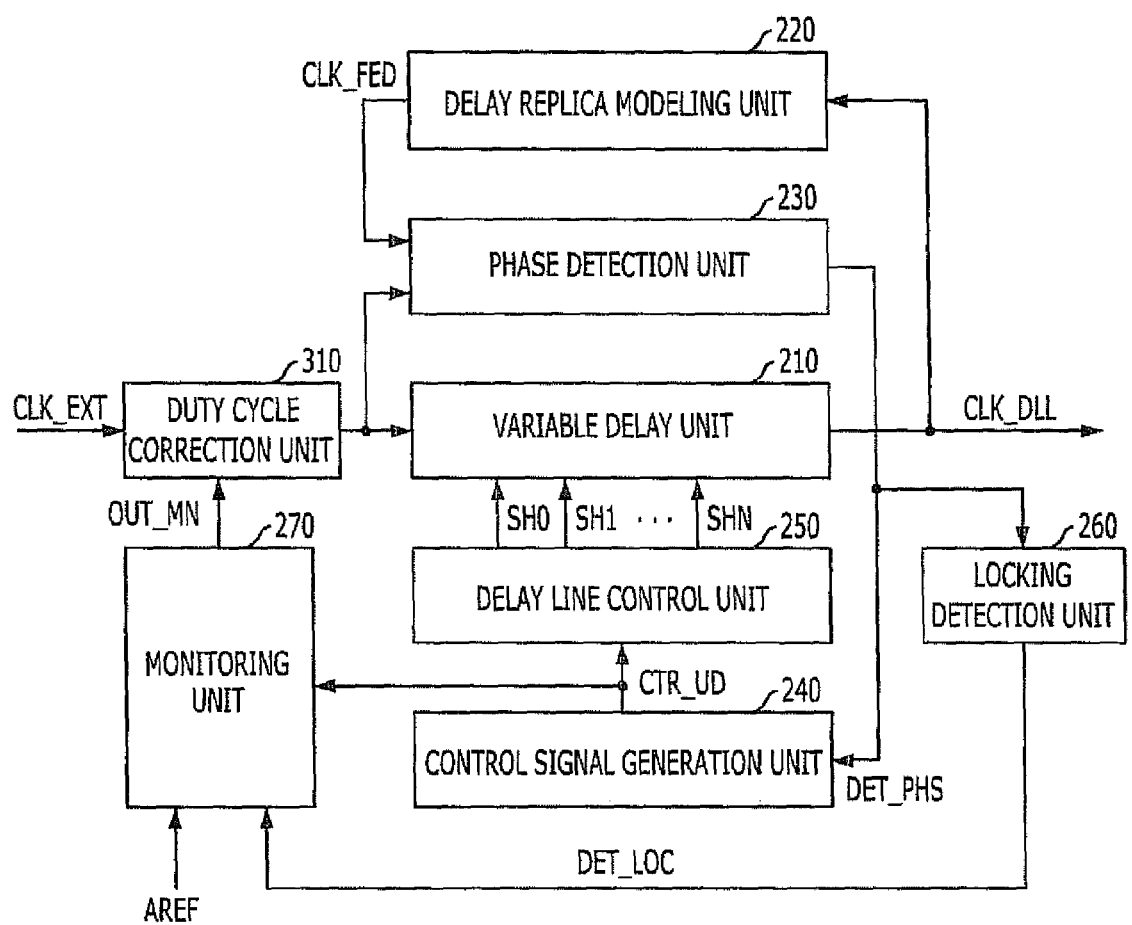
FIG. 3 is a block diagram of a semiconductor device in accordance with another embodiment of the present invention.

FIG. 3 is a block diagram of a semiconductor device in accordance with another embodiment of the present invention. Compared with the configuration of FIG. 2, a duty cycle correction unit 310 is additionally provided in the semiconductor device in accordance with the second embodiment of the present invention.

The duty cycle correction unit 310 corrects the duty cycle ratio of an external clock signal CLK_EXT, and is configured to control the duty cycle ratio of the external clock signal CLK_EXT in response to a monitoring result signal OUT_MN which is an output signal of the monitoring unit 270.

As described above, the monitoring result signal OUT_MN is a signal obtained by reflecting an environmental element. Therefore, the duty cycle correction unit 310 may control the duty cycle ratio of the external clock signal CLK_EXT depending on an environmental element reflected in the circuit. That is, when the duty cycle ratio of the external clock signal CLK_EXT is distorted by the environmental element reflected into the circuit, the duty cycle correction unit 310 may correct the distorted duty cycle ratio in response to the monitoring result signal OUT_MN.

In this embodiment of the present invention, a control signal used for generating the DLL clock signal CLK_DLL as an internal clock signal, that is, an up/down control signal CTR_UD may be used to monitor the environmental element reflected in the circuit, and the monitoring result signal OUT_MN obtained as the monitoring result may be used to correct the duty cycle ratio of the external clock signal CLK_EXT.

In this embodiment of the present invention, the up/down control signal CTR_UD is used for generating the monitoring result signal OUT_MN. However, the phase detection signal DET_PHS or the delay control signals SH0 to SHN may also be used. Furthermore, the monitoring result signal OUT_MN is used to correct the duty cycle ratio of the external clock signal CLK_EXT. However, the duty cycle ratio of the DLL clock signal CLK_DLL or the feedback clock signal CLK_FED as well as the external clock signal CLK_EXT may also be corrected. Furthermore, in this embodiment of the present invention, the monitoring result signal OUT_MN is used to correct the duty cycle ratio of the external clock signal CLK_EXT. However, the circuit composing the DLL may be controlled. For example, the time delay amount of the variable delay unit 210 or the delay replica modeling unit 220 may be controlled in response to the monitoring result signal OUT_MN.

Figure 4:
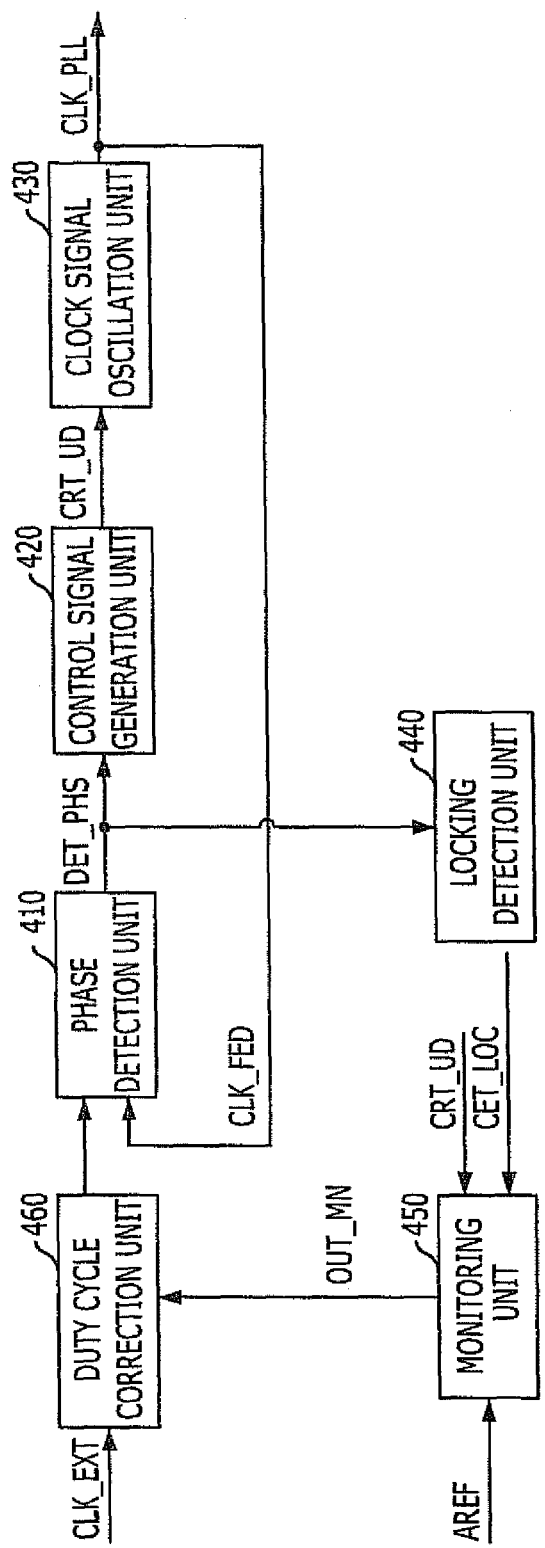
FIG. 4 is a block diagram of a semiconductor device in accordance with still another embodiment of the present invention.

FIG. 4 is a block diagram of a semiconductor device in accordance with another embodiment of the present invention, illustrating an example to which a Phase Locked Loop (PLL) is applied.

Referring to FIG. 4, the semiconductor device includes a phase detection unit 410, a control signal generation unit 420, a clock signal oscillation unit 430, a locking detection unit 440, a monitoring unit 450, and a duty cycle correction unit 460.

The phase detection unit 410 is configured to compare the phase of an output signal of the duty cycle correction unit 460 with that of a feedback clock signal CLK_FED to output a phase detection signal DET_PHS. The control signal generation unit 420 is configured to generate an up/down control signal CTR_UD in response to the phase detection signal DET_PHS. The clock signal oscillation unit 430 is configured to generate a PLL clock signal CLK_PLL at a frequency corresponding to the up/down control signal CTR_UD. For reference, the phase detection unit 410, the control signal generation unit 420, and the clock signal oscillation unit 430 compose an internal clock signal generation circuit for generating the PLL clock signal CLK_PLL, that is, a PLL.

Meanwhile, the locking detection unit 440 detects a locking time period of the PLL, and is configured to generate a locking detection signal DET_LOC in response to the phase detection signal DET_PHS. The monitoring unit 450 monitors environmental elements reflected in the circuit, and is configured to generate a monitoring result signal OUT_MN in response to the up/down control signal CTR_UD. The duty cycle correction unit 460 controls the duty cycle ratio of an external clock signal CLK_EXT, and is configured to control the duty cycle ratio of the external clock signal CLK_EXT in response to the monitoring result signal OUT_MN which is the output signal of the monitoring unit 450.

In this embodiment of the present invention, the up/down control signal CTR_UD used for generating the DLL clock signal CLK_DLL or the PLL clock signal CLK_PLL which is an internal clock signal may be used to monitor the environmental elements reflected in the circuit. Furthermore, the monitoring result signal OUT_MN generated using the up/down control signal CTR_UD may be used to control the circuit composing an internal clock signal generation circuit or the DCC to correct a change caused by the environmental elements reflected in the circuit.

In accordance with the embodiments of the present invention, the duty cycle ratio of the clock signal or the delay times are corrected depending on the environmental elements reflected in the circuit. Therefore, it is possible to guarantee a stable operation of the internal clock signal generation circuit.

While the present invention has been described with respect to the specific embodiments of the present invention, it will be apparent to those skilled in the art that various changes and modifications may be made without departing from the spirit and scope of the present invention as defined by the following claims.

What is claimed is:

1. A semiconductor device, comprising:
    a variable delay unit configured to delay an external clock signal by a time period corresponding to a delay control signal and to generate an internal clock signal;
    a delay replica modeling unit configured to generate a feedback clock signal by delaying the internal clock signal by a time period corresponding to a clock path and a data path through a circuit;
    a phase detection unit configured to compare a phase of the external clock signal with a phase of the feedback clock signal, and to generate a phase detection signal;
    a control signal generation unit configured to generate a control signal in response to the phase detection signal of the phase detection unit;
    a delay line control unit configured to control a time delay amount of the variable delay unit in response to the control signal;
    a locking detection unit configured to detect a locking operation completion time of an internal clock signal generation unit, and to generate a locking detection signal in response to the phase detection signal, wherein the internal clock signal generation unit includes the variable delay unit, delay replica modeling unit, phase detection unit, control signal generation unit and delay line control unit; and
    a monitoring unit configured to receive the locking detection signal, and to monitor environmental elements reflected in a circuit in response to the control signal and the locking detection signal,
    wherein the monitoring unit performs a monitoring operation after a locking operation of the internal clock signal generation unit has been completed.

2. The semiconductor device of claim 1, wherein the internal clock signal is controlled by an output signal of the monitoring unit.

3. The semiconductor device of claim 1, wherein the monitoring unit performs a monitoring operation in response to an auto-refresh operation.

4. A semiconductor device, comprising:
    a phase detection unit configured to compare a phase of an external clock signal with a phase of a feedback clock signal and to generate a phase detection signal;
    a control signal generation unit configured to generate a control signal in response to the phase detection signal of the phase detection unit;
    a clock signal oscillation unit configured to generate the feedback clock signal at a frequency corresponding to the control signal;
    a locking detection unit configured to detect a locking operation completion time of an internal clock signal generation unit, and to generate a locking detection signal in response to the phase detection signal, wherein the internal clock signal generation unit includes the phase detection unit, control signal generation unit and clock signal oscillation unit; and a monitoring unit configured to receive the locking detection signal, and to monitor environmental elements reflected in a circuit in response to the control signal and the locking detection signal,
    wherein the monitoring unit performs a monitoring operation after the locking operation of the internal clock signal generation unit has been completed.

5. A semiconductor device, comprising:
    an internal clock signal generation unit configured to receive an external clock signal and to generate an internal clock signal in response to a control signal;
    a monitoring unit configured to monitor environmental elements reflected in a circuit in response to the control signal; and
    a duty cycle correction unit configured to correct a duty cycle ratio of either the external clock signal or the internal clock signal in response to an output signal of the monitoring unit.

6. The semiconductor device of claim 5, further comprising a locking detection unit configured to detect a locking operation completion time of the internal clock signal generation unit.

7. The semiconductor device of claim 6, wherein the monitoring unit performs a monitoring operation after the locking operation has been completed.

8. The semiconductor device of claim 5, wherein the internal clock signal generation unit comprises:
    a variable delay unit configured to generate the internal clock signal by delaying the external clock signal by a time period corresponding to a delay control signal;
    a delay replica modeling unit configured to generate a feedback clock signal by delaying the internal clock signal by a time period corresponding to a clock path and a data path through a circuit;
    a phase detection unit configured to compare a phase of the external clock signal with a phase of the feedback clock signal;
    a control signal generation unit configured to generate the control signal in response to an output signal of the phase detection unit; and
    a delay line control unit configured to control a time delay amount of the variable delay unit in response to the control signal.

9. The semiconductor device of claim 5, wherein the internal clock signal generation unit comprises:
    a phase detection unit configured to compare a phase of the external clock signal with a phase of the feedback clock signal;
    a control signal generation unit configured to generate the control signal in response to an output signal of the phase detection unit; and
    a clock signal oscillation unit configured to generate the internal clock signal at a frequency corresponding to the control signal.

10. The semiconductor device of claim 5, wherein the monitoring unit performs a monitoring operation in response to an auto-refresh operation.

11. A method for operating a semiconductor device, comprising:
    comparing a phase of an external clock signal with a phase of a feedback clock signal;
    generating an internal clock signal through either an up frequency operation or a down frequency operation in response to a result of the comparison;
    generating a monitoring result signal in response to a control signal corresponding to either the up frequency operation or the down frequency operation, after a locking operation of the internal clock signal has been completed; and correcting a duty cycle ratio of either the external clock signal or the internal clock signal in response to the monitoring result signal.

12. The method of claim 11, wherein the generating of the internal clock signal is controlled in response to the monitoring result signal.

13. The method of claim 11, wherein the generating the monitoring result signal is controlled in response to an auto-refresh operation.

* * * * *